United States Patent [19]
Bell et al.

[11] Patent Number: 5,310,690
[45] Date of Patent: May 10, 1994

[54] METHOD FOR FORMING INTEGRATED CIRCUITS HAVING BURIED DOPED REGIONS

[75] Inventors: David A. Bell, Richardson; Robert H. Havemann, Garland, both of Tex.

[73] Assignee: Texas Instruments Incorporated, Dallas, Tex.

[21] Appl. No.: 880,477

[22] Filed: May 6, 1992

Related U.S. Application Data

[63] Continuation of Ser. No. 632,437, Dec. 21, 1990, abandoned, which is a continuation of Ser. No. 265,074, Oct. 31, 1988, abandoned.

[51] Int. Cl.$^5$ .......................... H01L 21/265
[52] U.S. Cl. ......................... 437/31; 437/26; 437/28; 437/74
[58] Field of Search ............ 437/26, 27, 28, 33, 437/74, 77, 56, 57, 61, 69, 34, 31; 148/DIG. 9, DIG. 117

[56] References Cited

U.S. PATENT DOCUMENTS

| | | | |
|---|---|---|---|
| 4,373,252 | 2/1983 | Caldwell | 437/26 |
| 4,435,895 | 3/1984 | Parrillo et al. | 437/44 |
| 4,710,265 | 12/1987 | Hotta | 437/29 |
| 4,761,384 | 8/1988 | Neppl et al. | 437/29 |
| 4,840,920 | 6/1989 | Suda | 437/69 |
| 4,889,825 | 12/1989 | Parrillo | 437/27 |

FOREIGN PATENT DOCUMENTS

| | | | |
|---|---|---|---|
| 0067661 | 6/1982 | European Pat. Off. | 27/08 |
| 0097379 | 6/1983 | European Pat. Off. | 21/82 |
| 0253724 | 7/1987 | European Pat. Off. | 21/74 |
| 0278619 | 1/1988 | European Pat. Off. | 21/82 |

Primary Examiner—Brian E. Hearn
Assistant Examiner—Tuan Nguyen
Attorney, Agent, or Firm—Ruben C. DeLeon; Richard L. Donaldson; William E. Hiller

[57] ABSTRACT

A method for fabricating an integrated circuit having a buried doped region is disclosed. A thermal oxide layer is formed over a portion of a p-type substrate at which an n+ buried doped region is not to be formed, masking the implant for the buried doped region. Anneal of the implant is performed in an oxidizing atmosphere, growing further oxide over the surface. The oxide layers are removed, and a p-type blanket implant is performed for isolation purposes and, if desired, to form a p-type buried doped region; the doping concentration of the n+ buried doped region retards diffusion of the boron to the surface thereover. Alternatively, a higher than normal doping level in the substrate can provide sufficient boron for isolation. An epitaxial layer is then grown over the surface, and the n-well is formed by implanting n-type dopant, with the p-well regions masked by a nitride mask; anneal of the n-well is also done in an oxidizing environment, so that consumption of a portion of the n-well by the oxide further planarizes the topography of the device.

16 Claims, 3 Drawing Sheets

METHOD FOR FORMING INTEGRATED CIRCUITS HAVING BURIED DOPED REGIONS

This application is a continuation of application Ser. No. 07/632,437, abandoned (which is a continuation of 07/265,074 filed on Oct. 31, 1988—now abandoned), filed Dec. 21, 1990.

This application is in the field Of methods of forming integrated circuits, and is more specifically directed to the formation of buried doped regions.

BACKGROUND OF THE INVENTION

In the manufacture of integrated circuits, buried doped regions are often used to provide a low resistivity layer under active portions of the circuit. A common example is the use of such a buried doped region as a subcollector in a conventional vertical bipolar transistor, where a subcollector underlies the base region. Electrical connection to the subcollector is made from the surface at a point separated from the active base-emitter region. As is well known, improved bipolar device performance can be obtained by reducing the collector series resistance through the use of a high doping concentration in the subcollector, and also by the design of active transistor doping profiles to minimize the distance that current must flow from the subcollector through the less heavily doped collector region to the base within the constraint of maintaining an adequate collector-base breakdown voltage.

Buried doped regions are used as subcollectors not only in the fabrication of bipolar integrated circuits, but also in modern BiCMOS integrated circuits which include bipolar transistors and MOS transistors of both channel conductivity types In the same chip. In BICMOS circuits, buried doped regions are used as a subcollector for the bipolar transistor, and also at the bottom of the n-type (and p-type) wells into which the MOS transistors are formed. N+ buried doped regions under n-wells, and p+ buried doped regions under p-wells, each provide for uniform bias of the overlying wells, improving the transistor performance. In addition, the use of buried doped regions underlying the wells reduces the tendency of the parasitic SCR formed by adjacent n-channel and p-channel MOS transistors to "latch-up." An example of the use of n+ and p+ buried doped regions in a BiCMOS structure is described in copending applications Ser. No. 129,261 and 129,271, filed Dec. 7, 1987 and assigned to Texas Instruments Incorporated.

As the feature sizes for modern integrated circuits become smaller, full realization of the increased density available from transistors having such smaller feature sizes becomes possible only if the devices can be placed closer together. The use of buried doped regions, however, is a limitation on the spacing of active devices from one another, as buried doped regions of common conductivity type which are associated with adjacent transistors must be electrically isolated.

One prior technique for such isolation includes the use of trench isolation between buried doped regions, as described in copending application Ser. No. 129,270 (TI-12481) filed Dec. 7, 1987 and assigned to Texas Instruments Incorporated. While such techniques effectively provide electrical isolation, the etching and refilling of trenches adds process complexity and cost to the manufacture of the device.

A less costly, and more conventionally used, technique for providing isolation between buried doped regions is to dope the space therebetween with dopant of the opposite conductivity type. Referring to FIG. 1, such a conventional technique will be illustrated. According to conventional Methods for forming buried doped regions, a nitride mask (generally overlying an oxide buffer pad) is provided over locations where the buried doped regions are not to be formed. N-type dopant is then introduced into the substrate 1 (generally lightly doped p-type) at the locations not covered by the silicon nitride mask. For n-type buried doped regions 2, antimony is a commonly used dopant due to its relatively slow diffusion rate in silicon, which provides for a greater degree of control of the placement of buried doped region 2 as compared with a dopant such as phosphorus. The structure is then annealed in an oxidizing atmosphere (for example, at a high temperature such as 1250 degrees Celsius) to drive-in the n-type dopant to form the n+ buried doped regions 2, and to form a thermal oxide layer 4 at the locations where the nitride mask is not present, The nitride mask is then removed, resulting in the structure shown in FIG. 1. In order to provide isolation between buried doped regions 2, it is desirable that the region 5 of substrate 1 disposed therebetween be more heavily doped than the substrate doping level to provide the desired electrical isolation therebetween. The thermal oxide layer 4 serves as a mask for the p-type implant (generally using boron) illustrated in FIG. 1 as doping the region 5 between buried doped regions 2. Use of this layer as a mask provides for a self-aligned process, as no additional masking layers, which must be aligned with the edges of the buried doped regions 2, are necessary.

However, use of the thermal oxide layer 4 as the mask for the boron implant as described above presents problems in the formation of the isolation region, and especially presents problems to the scaling of the resulting structure. When using the oxide layer 4 as a mask, the energy of the boron implant must be sufficiently low so that the oxide layer 4 indeed masks the implant, preventing counterdoping of buried doped regions 2. However, since the next step after formation of the isolation region normally involves an in situ silicon etch to clean the surface of substrate 1 prior to epitaxial silicon formation, the energy of the boron implant must be high enough so that a majority of the implanted region remains behind after this etch. It should further be noted that the thickness of the oxide layer 4 cannot be arbitrarily increased to serve as a better mask, since the topography of the surface of substrate 1 will be even less planar than is shown in FIG. 1, resulting in further problems during subsequent processing.

It should further be noted that, as shown in FIG. 1, the oxide layer 4 over buried doped regions 2 does not extend to the edges of buried doped regions 2, since buried doped regions 2 (even with antimony as the dopant) laterally diffuse during the anneal faster than the oxide layer 4 encroaches under the nitride mask. Accordingly, since the boron implant energy is held low enough to not penetrate the oxide layer 4, a region of boron will be formed near the surface, overlying the edges of buried doped regions 2. Referring to FIG. 2, another location of the same structure as FIG. 1 is illustrated, showing the boundary between a buried doped region 2 over which an n-well is to be formed, and an adjacent p-well. After the formation of an epitaxial layer 6, into which n-well 8 and p-well 10 are formed for the MOS transistors in a CMOS process, the boron layer formed at the surface of the n+ buried doped region 2 near its edges (i.e., where not covered by oxide layer 4) has out-diffused into the epitaxial layer 6, forming a filament 12 of p-type material which extends between n-well 8 and its underlying buried doped region 2.

Further with reference to FIG. 2, it should be noted that the topography of the structure is far from planar. A first step 14 is formed by the consumption of substrate 1 during the formation of buried doped region 2, as described above relative to FIG. 1. In addition, conventional processing methods for forming self-aligned twin wells often further form a second step 16. In such a conventional method, n-well 8 is formed in the same manner as buried doped region described above, since the n-well 8 is implanted with a mask over the region where p-well 10 is to be formed, followed by an anneal in an oxidizing atmosphere to form a well masking oxide layer over the n-well 8. This well masking oxide layer (not shown) masks the p-type boron implant used to form p-well 10 from the n-well 8, in similar fashion as oxide layer 4 masked the isolation implant from buried doped regions 2. However, the result is a second step 16 in the topography, aggravating the non-coplanarity of the resulting structure. Such steps in the surface topography create step coverage problems for overlying conductive layers, and also require the use of increased overetch of such conductive layers to clear filaments remaining at the bottom of the steps after anisotropic etching. Such an overetch reduces the line width of the remaining lines, and also places severe constraints on the selectivity properties of the etch. Steps in the surface topography also reduce the ability to reliably form electrical contact to the surface of the p-well 10 and the surface of the n-well 8 using the same pattern and etch steps. In addition, the difference in height between the surfaces of the n-well 8 and p-well 10 reduces the ability to photolithographically pattern features at the surface of the structure, since the depth of focus in the patterning of sub-micron features may not be as large as the step from the surface of n-well 8 to the surface of p-well 10.

It has also been noted that the presence of a masking nitride layer over silicon during a high temperature anneal (such as the buried doped region anneal described above) provides the possibility of defects generated in the silicon surface underlying the nitride masking layer, especially in the presence of a heavily doped region such as the buried doped region.

It is therefore an object of this invention to provide a method for formation of buried doped regions in an integrated circuit which allows for a high energy implant of isolating dopant therebetween, thereby providing for smaller spacing requirements.

It is another object of this invention to provide such a method which results in improved planar topography over prior methods.

It is another object of this invention to provide such a method which has reduced defect density after the annealing steps.

It is yet another object of this invention to provide the above benefits without the addition of a masking step.

Other objects and advantages of the invention will become apparent to those of ordinary skill in the art having reference to the following specification in conjunction with the drawings.

SUMMARY OF THE INVENTION

The invention ay be incorporated into a method for forming an integrated circuit having buried doped regions by removing the oxide layer formed over the buried doped region during its anneal, and by performing a blanket implant of dopant of the opposite conductivity type of the buried doped region, at a relatively high energy. Diffusion of the implanted dopant will be retarded by the high concentration of the buried doped region, except between the buried doped regions where a doped isolation region will be formed. Alternatively, in the case of n-type buried doped regions formed into a p-type substrate, a higher boron doping concentration for the substrate may be used, relying on the consumption of boron in the oxidation during the buried doped region anneal, and the retarded diffusion of boron in the heavily doped n-type buried doped region. In either alternative, formation of an oxide layer over the portions of the substrate where no buried doped region is to be formed can be used to reduce the steps between wells of opposite types.

DETAILED DESCRIPTION OF THE PREFERRED EMBODIMENTS

Figure 3A:
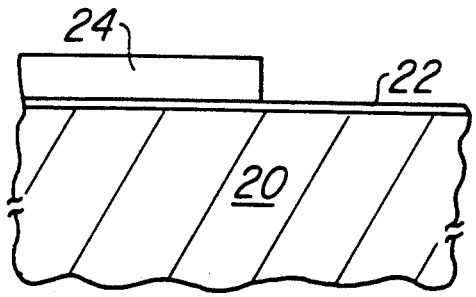
FIGS. 3a through 3i are cross-sectional diagrams of an integrated circuit at various stages of construction according to the method of the invention.

Referring to FIGS. 3a through 3i, the construction of an integrated circuit according to the invention will be described in detail. The structure of FIG. 3a illustrates a p-type substrate 20 which, according to a first embodiment of the invention, is relatively lightly doped, for example on the order of 1E15 to 2E15 cm$^{-3}$. By way of thermal oxidation, a thin layer of pad oxide 22 of a thickness on the order of 25 to 50 nm is formed over the surface of the substrate. A masting layer 24 of silicon nitride is then deposited by way of CVD to a thickness on the order of 100 to 150 nm. Conventional photolithography is then used to define the portions of nitride layer 24 which are to remain, and an etch is performed to remove the undesired portions, resulting in the structure of FIG. 3a. It should be noted that the pad oxide layer 22 is used, as is well known in the art, to minimize mechanical stress during the nitride deposition, etch, and oxidation steps. According to the invention, nitride layer 24 is left in place over the portion of the substrate 20 at which the n+ buried doped regions are to be formed, as will be evident later.

Figure 3B:
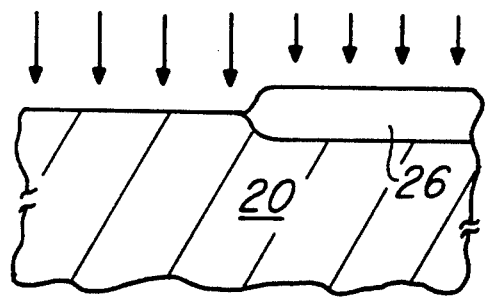

The structure of FIG. 3a is then placed in an oxidizing environment in order to form silicon dioxide layer 26 shown in FIG. 3b, to a thickness on the order of 300 to 600 nm. It should be noted that a portion of substrate 20 is of course consumed in the formation of oxide layer 26, and that the nitride mask layer 24 serves as a barrier to oxygen atoms, so that oxidation does not occur thereunder. While the above description of the method of forming oxide layer 26 is according to the well known local oxidation of silicon (LOCOS) technique, it should of course be noted that other techniques for forming oxide layer 26 are equally applicable in the method according to the invention, including the poly-buffered LOCOS technique described in U.S. Pat. No. 4,541,167 issued Sep. 17, 1985 and assigned to Texas Instruments Incorporated. Nitride layer 24 is then stripped, and pad oxide 22 removed by way of a short deglaze, exposing the portion of substrate 20 into which the n+ buried doped region is to be formed, as illustrated in FIG. 3b. The structure is then subjected to ion implantation of an n-type dopant, preferably antimony or arsenic, which is performed at the desired dose and energy to form the eventual n+ buried doped region. The energy of the implant should, of course, be selected so that oxide layer 26 acts as a mask to the implant. An example of the implant used to form this region is an antimony implant at an energy on the order of 40 keV, at a dose on the order of $5E15$ cm$^{-2}$. Alternatively, a higher energy implant, such as 100 keV antimony, may be performed without removing pad oxide 22. Such a higher energy implant can implant the dopant through pad oxide 22, but not through oxide layer 26, thereby eliminating the step of the deglaze to remove pad oxide 22.

Figure 3C:
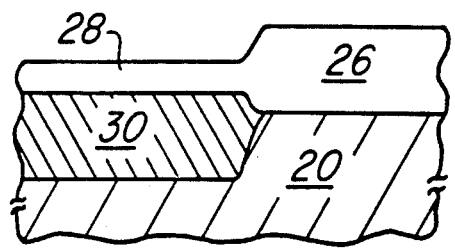

Subsequent to the n-type implant, an anneal is performed in an oxidizing atmosphere at a high temperature, for example on the order of 1250 degrees Celsius for an antimony implant, to drive the implanted ions and form the n+ buried doped region 30 of FIG. 3c. In this example, the resultant buried doped region will have a high peak doping concentration, for example on the order of $1E19$ cm$^{-3}$. This anneal will form an oxide layer over the surface of buried doped region 30, and will of course further oxidize the remainder of the structure to slightly increase the thickness of oxide layer 26, as shown in FIG. 3c. Aside from greatly retarding the oxidation of the substrate 20 thereunder, oxide layer 26 also inhibits the lateral diffusion of the n+ buried doped region 30 during this anneal, since the recessed portion of oxide layer 26 presents a diffusion barrier to the implanted n-type dopant. It should be noted that there is no silicon nitride layer on the surface of substrate 20 during this anneal. It has been found that the presence of a nitride layer during this high temperature anneal, in conjunction with a heavily doped region such as n+ region 30, can form defects in the underlying silicon which will render inoperative transistors formed in the affected areas. The method according to the invention described herein allows this anneal to be performed without such a nitride layer, improving the manufacturability of the integrated circuit so constructed.

Figure 1:
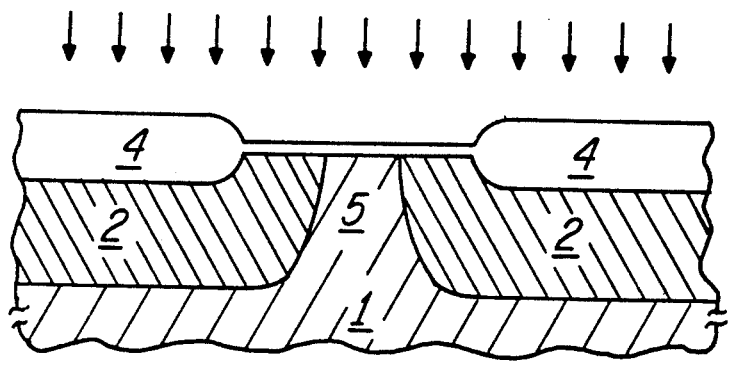
FIG. 1 is a cross-sectional diagram of an integrated circuit containing a pair of n-type buried doped regions, at a particular stage of formation according to the prior art.
Figure 2:
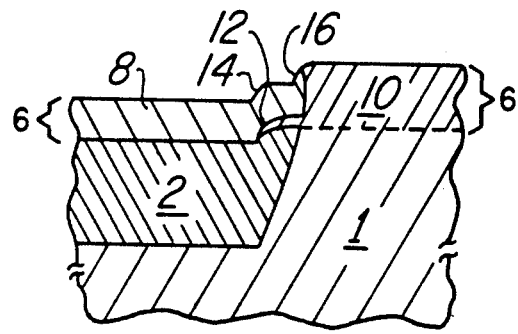
FIG. 2 is a cross-sectional diagram of the integrated circuit of FIG. 1 at the edge of an n-type buried doped region with an n-well thereover and adjacent a p-well, at a particular stage of formation according to the prior art.
Figure 3D:
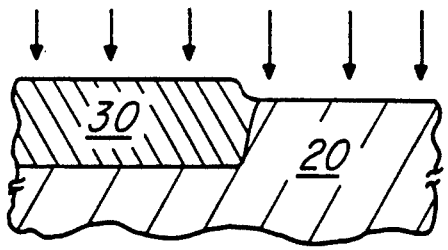
Figure 3E:
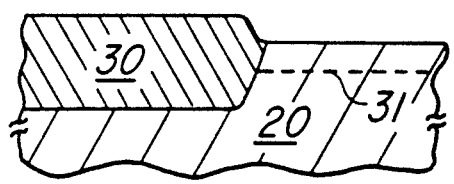

Oxide layers 26 and 28 are then removed. According to this embodiment of the invention, utilizing a relatively lightly-doped p-type substrate, a blanket p-type implant is then performed as illustrated in FIG. 3d. The purpose of this implant is to increase the isolation between neighboring n+ buried doped regions 30, as described hereinabove. According to the invention, this implant can be done in blanket fashion and at a high energy, as is preferred for isolation purposes, since the high doping concentration of n+ buried doped region 30 will retard the diffusion of the boron dopant therewithin. The retarded diffusion of boron in n+ buried doped region 30 can thus prevent the counterdoping of the surface of buried doped region 30 (as illustrated in FIG. 2), so that the interface between buried doped region 30 and the n-well which will be formed thereover will not be compromised by the boron implant. In the portion of substrate 20 where n+ buried doped regions 30 are not located, the diffusion of the boron dopant will not be so retarded, so that boron dopant will diffuse upwardly to make good contact with the p-well to be formed thereover, as well as to provide good isolation between neighboring n+ buried doped regions 30. Since the implant is done without an oxide mask as shown in FIG. 1, the energy of the implant can be set to a high level, for example on the order of 100 to 300 keV or higher, to achieve the desired isolation characteristics. It should be noted that this boron implant can be of a sufficiently high dose (for example, $1E12$ to $1E13$ cm$^{-2}$) to form a p-type buried doped region, serving similar functions as n+ buried doped regions 30, if so desired. The location of the more highly doped p-type region is indicated by dashed line 31 in FIG. 3e.

Alternatively, if the energy of the boron implant is increased to a very high value, for example exceeding 300 keV, the implant shown in FIG. 3c may be performed with oxide layers 26 and 28 in place. Such a high energy implant would locate the implanted boron even deeper into n+ buried doped region 30, further reducing the extent to which the boron may updiffuse into the epitaxial layer which will be formed thereover. In such an alternative, oxide layers 26 and 28 would be removed after the implant, and prior to formation of an epitaxial layer, described below.

According to an alternate embodiment of the invention, a more heavily doped p-type substrate 20 may be used, for example having a dopant concentration on the order of $1E16$ to $5E16$ or higher, which can allow elimination of the boron implant step described immediately above. Such a substrate concentration can provide sufficient isolation between neighboring n+ buried doped regions 30. Diffusion of this additional concentration of boron in substrate 20 will also be retarded within n+ buried doped regions 30 as in the case of the implant, allowing a good interface between n+ buried doped regions 30 and the n-wells to be formed thereover. In addition, boron from substrate 20 will segregate into the oxide layer 28 overlying n+ buried doped regions 30, further reducing the boron surface concentration in this alternate embodiment of the invention.

Figure 3F:
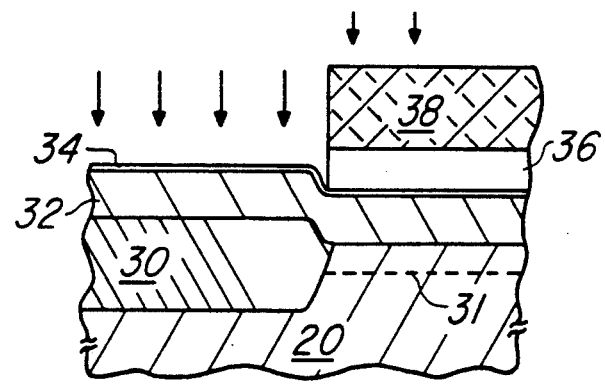

Referring now to FIG. 3f, the remainder of the process according to the invention will be described. It should be noted that the following steps may be performed in combination with either of the above-described alternatives (i.e., with or without the boron implant of FIG. 3d). An epitaxial layer 32 is grown according to conventional techniques on the surface of the structure of FIG. 3e, to the desired thickness. As described in said application Ser. No. 129,261, it is preferable for the performance of bipolar transistors that the epitaxial layer 32 be relatively thin (for example on the order of 0.75 to 1.50 microns), and for the performance of the n-channel MOS transistors that epitaxial layer 32 be relatively lightly doped, approaching intrinsic levels. However, for the purpose of the instant invention, it should be noted that the thickness and the doping concentration of epitaxial layer 32 is arbitrary, and depends upon the type and performance of the resulting integrated circuit.

Figure 3G:
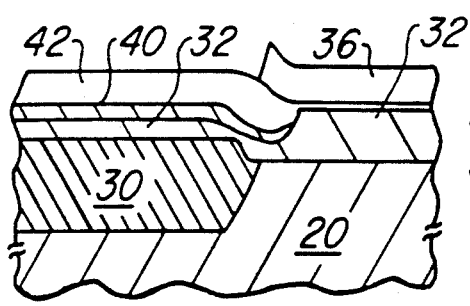
Figure 3H:
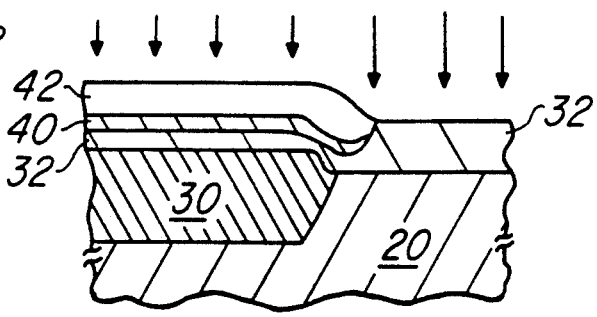

Subsequent to the formation of epitaxial layer 32, formation of the n-wells and p-wells into which the active devices will be formed is then accomplished. For formation of an n-well overlying n+ buried doped region 30, a pad oxide 34 is again formed (as in the method of forming n+ buried doped region 30 described hereinabove) to a thickness on the order of 25 to 50 nm. Masking nitride layer 36 is deposited, followed by the deposition of a photoresist layer 38 which is photolithgraphically patterned and developed to define the location of the n-well, and nitride layer 36 is removed therefrom, resulting in the structure of FIG. 3f. The location of the edge of photoresist layer 38 (and nitride layer 36) can be aligned with the small step in epitaxial layer 32 which resulted from the consumption of substrate 20 during the formation of oxide layer 26 in FIG. 3b. N-type dopant is then implanted for the formation of the n-well, with photoresist 38 and nitride layer 36 masking the implant from the locations at which the n-well is not to be formed. An example of an n-well implant into a very lightly doped epitaxial layer is a two step implant, consisting of a first implant of phosphorous at a dose on the order of 1E12 cm$^{-2}$ at 70 keV followed by a second phosphorous implant at a dose of 1.2E12 cm$^{-2}$ at 350 keV. Of course, a single step n-well implant, and other doses, energies or dopant species may be used depending upon the desired well characteristics. Following the n-well implant, photoresist layer 38 is stripped, and a thick oxide layer 42 is thermally formed over the implanted region as shown in FIG. 3g. Oxide layer 42 will selectively form over n-well 40 due to the presence of nitride layer 36; an exemplary thickness for oxide layer 42 is on the order of 300 to 500 nm. The n-type implanted region will diffuse to some extent during this oxidation to begin the formation of n-well 40, as also shown in FIG. 3g. Of course, a portion of the surface of n-well 40 is consumed by this oxidation; since, however, the surface of epitaxial layer 32 at this location was higher than the surface not overlying n+ buried doped region 32, this oxidation tends to reduce the step as shown in FIG. 3g. A dip will still be present between the edge of n-well 40 and the original edge of n+ buried doped region 30, since these boundaries do not necessarily coincide. However, this dip is located at a portion of the structure at which it is unlikely that any active devices will be formed, and the depth of this dip is relatively shallow so that undesirable effects from the dip are reduced.

After the formation of oxide layer 42, nitride layer 36 is removed, and a boron implant is then performed, using oxide layer 42 as a mask to prevent the counter-doping of the n-well by the boron implant. An example of the dose and energy for such an implant is a dose of 1E12 cm$^{-2}$ at an energy on the order of 50 keV. After the implant, a drive-in anneal for the wells is performed in an inert atmosphere to diffuse the dopants to the desired well depth. Oxide layer 42 may be removed either prior to, or after, the well drive-in anneal. The resultant structure is illustrated in FIG. 3i, showing the formation of p-well 44 overlying the portion of substrate 20 not having n+ buried doped region 30 (and, in the case of the implanted isolation layer, overlying the boron implanted region 31).

Figure 3I:
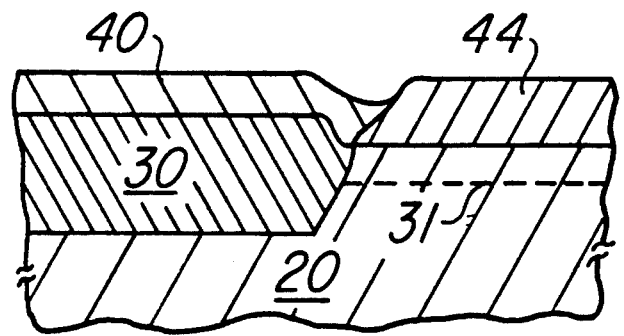

As is apparent from FIG. 3i, the top surface of n-well 40 and p-well 44 are relatively coplanar, especially when compared against the prior technique illustrated in FIG. 2. This improved topography results in improved photolithgraphy capability for the structure in later steps, since the topography is more likely to be within the depth of focus of the photolithographic exposure equipment. In addition, planarization of overlying dielectric material is facilitated since the steps at the surface of the structure are of reduced height, thereby reducing the length of any etchback used in such planarization. In the event that such planarization is used, the formation of contact openings through such an overlying oxide is facilitated since the depth of the openings to n-well 40 and p-well 44 will be virtually identical, reducing the possibility that contact to the lower surface will require longer etching than contact to the upper surface. In addition, the resultant structure provides for a smoother topography over which conductive layers (such as polysilicon or metal) may be formed, reducing the problems associated with step coverage often encountered in structures having a non-coplanar topography.

Figure 4:
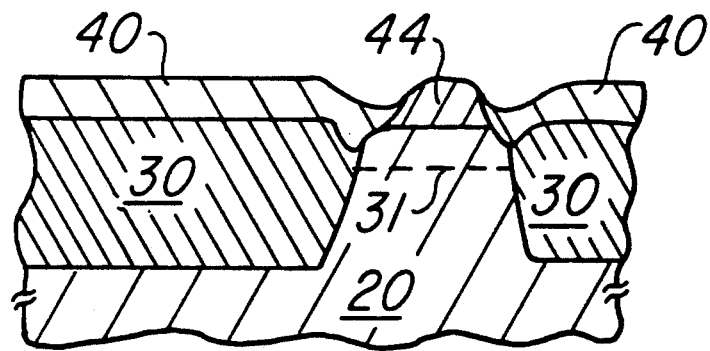
FIG. 4 is a cross-sectional diagram of the integrated circuit of FIG. 3i at a location having adjacent n-type buried doped regions, constructed according to the invention.

FIG. 4 illustrates another location of an integrated circuit showing neighboring n+ buried doped regions 30, with a portion of p-type substrate 20 disposed therebetween. In this case, p-well 44 will not contain any active devices but, in combination with the increased p-type doped region 31, will provide good electrical isolation between n+ buried doped regions 30, even if closely spaced as shown in FIG. 4.

Subsequent to the completion of the method described hereinabove, transistors and other elements, as well as connections therebetween, are formed into p-well 44 and n-well 40. An example of such structures and a method for their formation is described in said copending applications Ser. No. 129,261 and 129,271, incorporated herein by this reference. Individual circuits are then separated from portions of substrate 20, and external connections made thereto by way of wire bonding, direct bump connection, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments Incorporated.

Although the invention has been described in detail herein with reference to its preferred embodiments, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

We claim:

1. A method for fabricating an integrated circuit at a surface of a semiconductor substrate of a first conductivity type, comprising:

forming a first masking layer at a first location of said surface;

doping a second location of said surface, said second location not covered by said first masking layer, with dopant of a second conductivity type;

implanting both said first and second locations with dopant of said first conductivity type through said first masking layer; and forming a layer of semiconductor material over said first and second locations after said implanting step, so that said doped second location of said surface forms a buried doped region.

2. The method of claim 1, further comprising: removing said first masking layer after said implanting, and prior to said forming of said layer of semiconductor material.

3. The method of claim 1, wherein said step of doping said second location comprises:
   implanting dopant of said second conductivity type, said first masking layer masking said dopant of said second conductivity type from reaching said first location of said surface lying thereunder; and
   heating said semiconductor substrate to diffuse said dopant of said second conductivity type.

4. The method of claim 3, wherein said heating step is performed in an oxidizing atmosphere.

5. The method of claim 1, wherein said step of forming said first masking layer comprises:
   forming a mask over said second location of said surface but not said first location of said surface, said mask being a barrier to oxidation; and
   heating said semiconductor substrate in an oxidizing atmosphere to form said first masking layer at said first location of said surface.

6. The method of claim 1, further comprising:
   forming a second masking layer over said layer of semiconductor material at a location overlying said first location of said surface; and
   implanting said layer of semiconductor material with dopant of said second conductivity type at a location overlying said buried doped region, said second masking layer preventing said dopant from reaching the portion of said layer of semiconductor material lying thereunder; and
   heating said semiconductor substrate to diffuse said dopant in said layer of semiconductor material to form a well of said second conductivity type.

7. The method of claim 6, wherein said heating step is done in an oxidizing atmosphere to form a well oxide layer overlying said well.

8. The method of claim 7, further comprising:
   removing said second masking layer;
   implanting said layer of semiconductor material with dopant of said first conductivity type, said well oxide layer preventing said dopant of said first conductivity type from reaching said well of said second conductivity type; and
   heating said semiconductor substrate to diffuse said dopant of said first conductivity type in said layer of semiconductor material to form a well of said first conductivity type.

9. The method of claim 6, wherein said buried doped region is relatively more highly doped than said well of said second conductivity type.

10. The method of claim 1, wherein the doping concentration of said buried doped region is relatively higher than the doping concentration of said semiconductor substrate.

11. The method of claim 1, wherein the doping concentration of said first location after said implanting is approximately one order of magnitude greater than that of said semiconductor substrate.

12. The method of claim 1 wherein said step of forming a first masking layer is performed by oxidation.

13. The method of claim 1 wherein said step of doping a second location of said surface is performed by implantation.

14. The method of claim 1, wherein said first conductivity type is n-type and said dopant is antimony.

15. The method of claim 1, wherein said second conductivity type is n-type and said dopant is antimony.

16. A method for fabricating an integrated circuit at a surface of a semiconductor substrate of a first conductivity type, comprising:
   forming a first masking layer at a first location of said surface;
   doping a second location of said surface, said second location not covered by said first masking layer, with dopant of a second conductivity type;
   implanting both said first and second locations with dopant of said first conductivity type;
   removing said first masking layer; and
   after removal of said first masking layer, forming an epitaxial layer over said first and second locations after said implanting step, so that said doped first and second locations of said surface form buried doped regions.

* * * * *